United States Patent
Yedinak et al.

(10) Patent No.: US 7,230,313 B2
(45) Date of Patent: Jun. 12, 2007

(54) VOLTAGE DIVIDER FIELD PLATE TERMINATION WITH UNEQUAL FIXED BIASING

(75) Inventors: Joseph A. Yedinak, Mountaintop, PA (US); Dwayne S. Reichl, Pocono Lake, PA (US); Bernard J. Czeck, Mocanaqua, PA (US); Douglas J. Lange, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/682,323

(22) Filed: Oct. 9, 2003

(65) Prior Publication Data

US 2004/0135213 A1 Jul. 15, 2004

Related U.S. Application Data

(60) Provisional application No. 60/418,855, filed on Oct. 16, 2002.

(51) Int. Cl.
*H01L 29/78* (2006.01)
(52) U.S. Cl. ...................... 257/500; 257/409
(58) Field of Classification Search ............. 257/328, 257/343, 487–489, 409, 500
See application file for complete search history.

(56) References Cited

U.S. PATENT DOCUMENTS

| 5,382,825 A * | 1/1995 | Neilson ............... 257/489 |
| 6,246,101 B1 * | 6/2001 | Akiyama ............. 257/508 |
| 6,525,390 B2 * | 2/2003 | Tada et al. .......... 257/489 |
| 2001/0004124 A1 * | 6/2001 | Noda et al. ......... 257/401 |

* cited by examiner

*Primary Examiner*—Thomas L. Dickey
(74) *Attorney, Agent, or Firm*—Thomas R. FitzGerald, Esq.; Hiscock & Barclay, LLP

(57) ABSTRACT

An integrated circuit includes a die having a device layer. An insulating layer is disposed over the device layer. A die street defines the outermost bounds of the die. A voltage divider network including a plurality of resistive elements derives a plurality of predetermined bias voltages. A field plate termination includes a plurality of field plates disposed on the oxide layer and are laterally spaced apart relative to each other and relative to the die street. Each of the plurality of field plates is electrically connected to a corresponding bias voltage. The bias voltage applied to a given field plate is determined by and increases with the proximity of that field plate relative to the die street.

20 Claims, 4 Drawing Sheets

VOLTAGE DIVIDER FIELD PLATE TERMINATION WITH UNEQUAL FIXED BIASING

CROSS-REFERENCE TO RELATED APPLICATIONS

This application claims the benefit of the filing date of provisional patent application Ser. No. 60/418,855 filed Oct. 16, 2002.

FIELD OF THE INVENTION

The present invention relates to field plate terminations for reducing depletion layer electric field curvature in integrated circuits.

DESCRIPTION OF THE RELATED ART

Planar diffusion technology is widely used in the fabrication of integrated circuits (ICs), and is based upon the selective introduction of dopants into the semiconductor surface by either vapor phase deposition using an oxide mask or by ion implantation using a photoresist mask. Junctions are formed by the diffusion of the dopant into the semiconductor. This method forms a parallel-plane junction within the diffusion window. However, dopant diffuses laterally at the edges of the diffusion window and at the termination of the junction.

The lateral diffusion of dopant forms a cylindrical junction along (i.e., below) the straight edges of the diffusion window and a spherical junction at the corners. When a reverse bias is applied to the junction, the depletion region contour follows the edge of the junction. The depletion region spreads non-uniformly into the N and P regions of the junction and results in crowding of the field lines at the edges of the junction. The crowding of the electrical field lines is more severe for shallow junctions and/or small radii of curvature than for deeper junctions and/or larger radii of curvature, and more severe for spherical junctions than for cylindrical junctions. The crowding of the electrical field results in a reduction of the breakdown voltage relative to the breakdown voltage of the lightly doped region. This reduction in breakdown voltage is typically undesirable.

Junction edge terminations may incorporate multiple floating potential ring structures with or without field plates, a single field plate with multiple steps, or biased multiple field plates of various widths and relative separations to alleviate the electrical field crowding described above. However, such multiple ring and/or plate structures consume valuable die space. Further, the electrical field becomes increasingly crowded at the rings and/or field plates that are furthest from the street of the die. Therefore, a reduction in the breakdown voltage may still occur. To address this problem some have provided multiple diodes in a string across the top of the die and then connected one or more series of diodes to the field plates in order to bias them. However, such techniques depend upon discrete voltage drops and are independent of the voltage applied to the device.

Therefore, what is needed in the art is a method and apparatus that enhances the breakdown voltage of a planar junction termination and yet consumes less die space relative to conventional devices and/or methods for so doing. It is also desired to have a technique that varies with the applied voltage and can be continuously varied by percent of voltage.

SUMMARY OF THE INVENTION

The present invention provides an integrated circuit having a field plate termination that consumes less lateral die space, varies with the applied voltage and provides a virtual continuous distribution of voltage bias to the filed plates.

The invention comprises, in one form thereof, a die having a device layer. An insulating layer is disposed over the device layer. A die street defines the outermost bounds of the die. A voltage divider network including a plurality of resistive elements derives a plurality of predetermined bias voltages. A field plate termination includes a plurality of field plates disposed on the oxide layer and are laterally spaced apart relative to each other and relative to the die street. Each of the plurality of field plates is electrically connected to a corresponding bias voltage. The bias voltage applied to a given field plate is determined by and increases with the proximity of that field plate relative to the die street.

An advantage of the present invention is that approximately the same breakdown voltage is achieved with three, rather than five or more, field plates.

Another advantage of the present invention is that less die space is consumed relative to a conventional field plate termination.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein.

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 1:
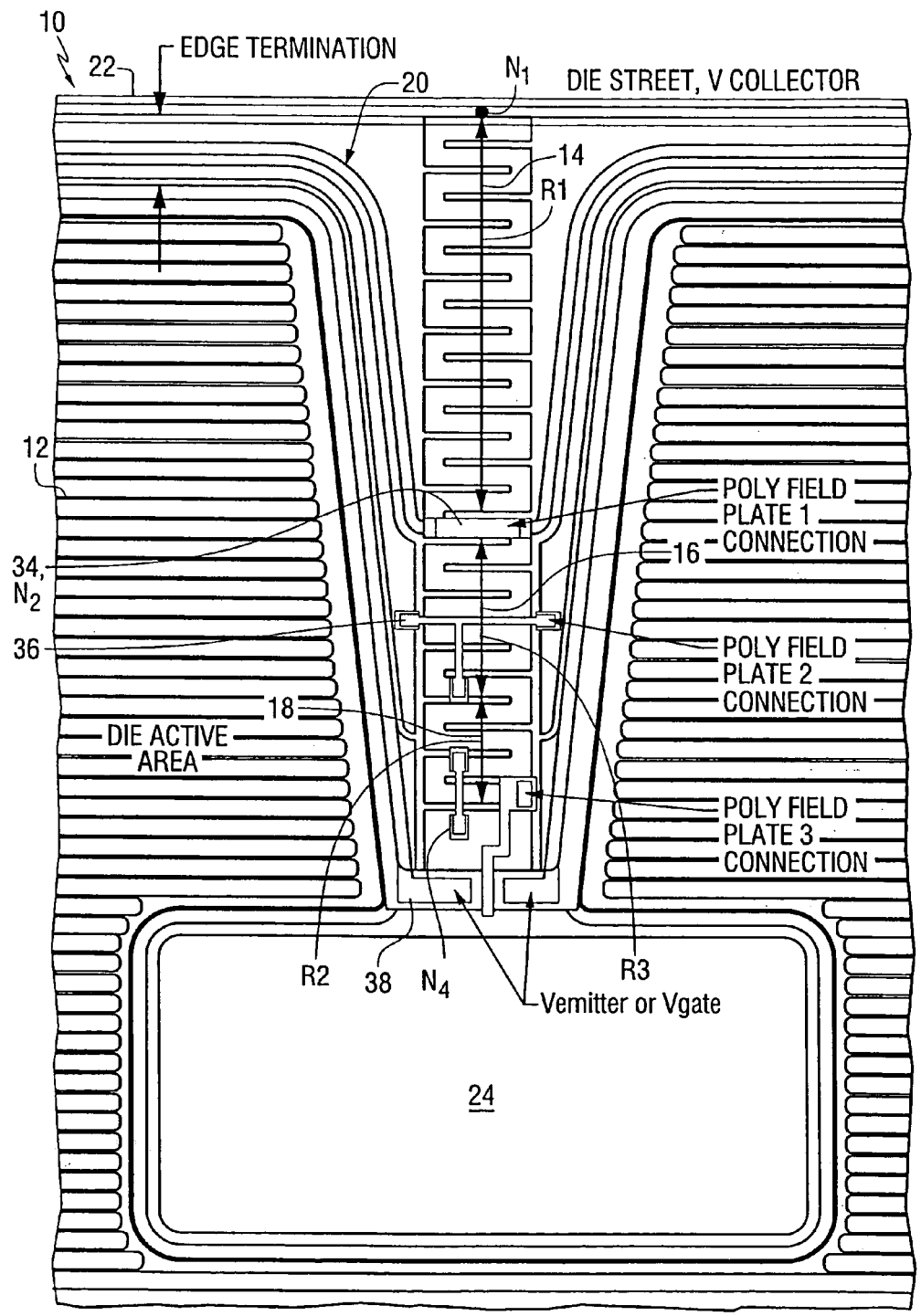
FIG. 1 is a cross-section of an integrated circuit including one embodiment of a field plate termination of the present invention.

Referring now to the drawings and particularly to FIG. 1, there is shown a portion of an integrated circuit having one embodiment of the field plate termination of the present invention. Integrated circuit 10 is formed on die 12. Integrally formed with die 12 are resistors 14, 16 and 18, field plate edge termination 20, die street 22, and bond pad 24.

Integrated circuit (IC) 10 is, for example, a relatively high-power integrated gate bipolar transistor (IGBT) or metal oxide semiconductor field effect transistor (MOSFET). However, it is to be understood IC 10 can be alternately configured, such as, for example, substantially any type of integrated circuit that requires or may benefit from the inclusion of a field plate termination.

Figure 4A:
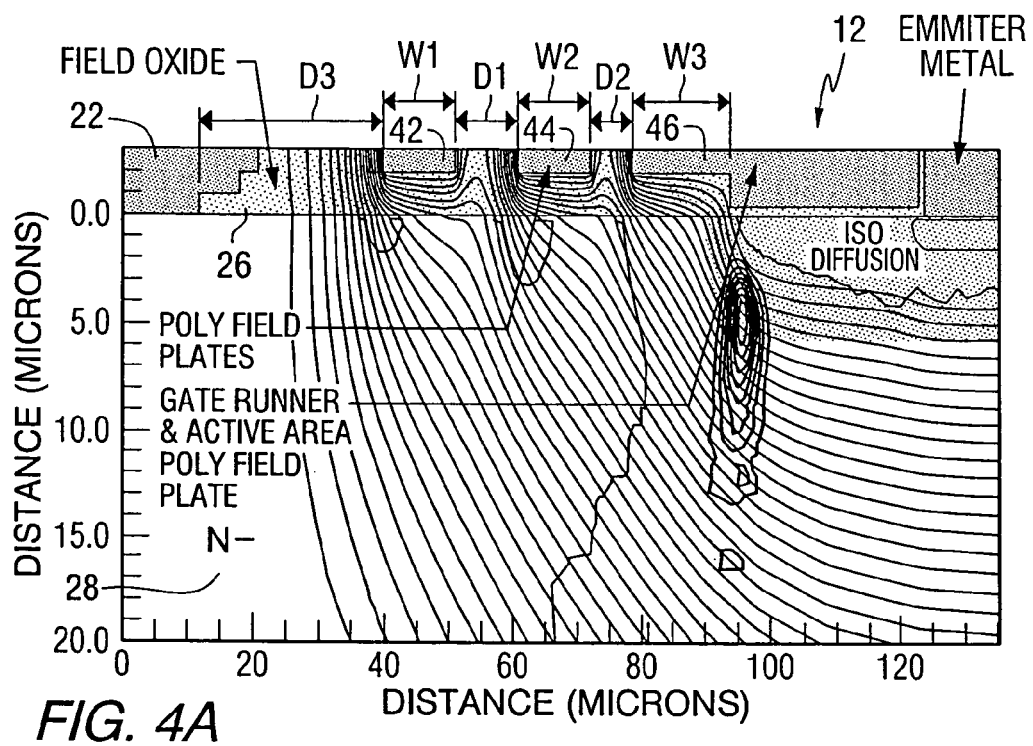
FIG. 4A is a cross-sectional view of, and shows the impact ionization/potential contour for, the integrated circuit of FIG. 1.

Die 12 includes, as best shown in FIG. 4A, field oxide or insulating layer 26, typically of silicon dioxide and boron phosphate silicon glass (BPSG), and device layer 28, typically of silicon. Die 12 also includes various areas of high and/or low dopant concentrations as well as other typical and conventional features, none of which are referenced.

Figure 2:
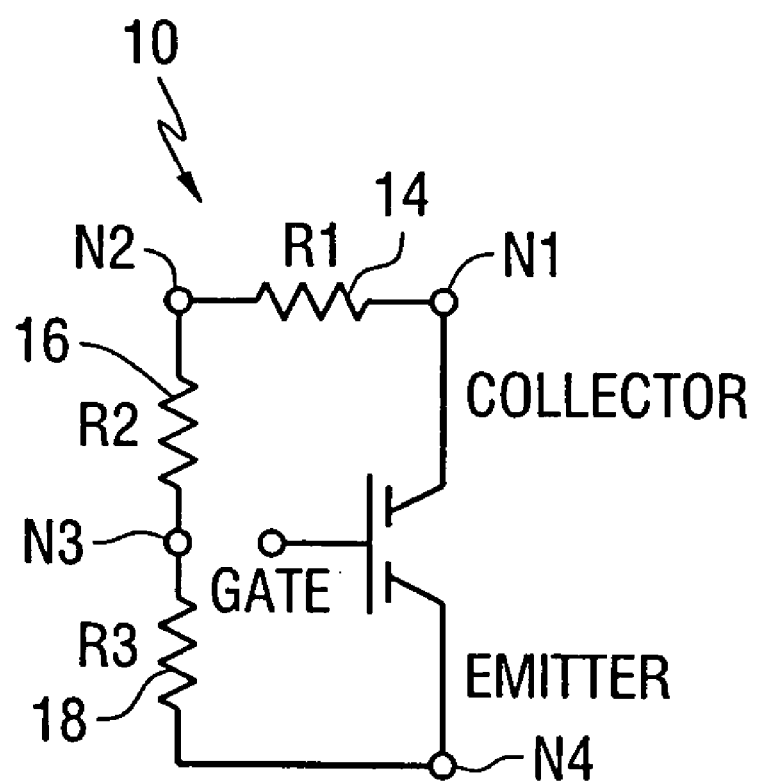
FIG. 2 is a schematic diagram of one embodiment of a voltage divider network for the field plate termination of FIG. 1.

Resistors 14, 16 and 18 are electrically interconnected in a series configuration thereby forming a voltage divider network, and to respective portions of field plate termination 20 as will be more particularly described hereinafter. Resistors 14, 16 and 18 are conventional integrated circuit resistors, and are well known in the art. Generally, resistor 14 is connected at a first end thereof (not referenced) to die street 22 at node N1 (FIGS. 1 and 2), and at its other end resistor 14 is electrically connected at node N2 (FIGS. 1 and 2) to resistor 16. Field plate connection 34 electrically connects node N2, i.e., the node common to resistors 14 and 16, to a corresponding portion or plate of field plate termination 20. Resistor 16 is electrically connected at node N3 (FIGS. 1 and 2) to resistor 18. Resistor 18 is, in turn, electrically connected to bond pad 24 at node N4. Field plate connection 36 electrically connects node N3, i.e., the node common to resistors 16 and 18, to a corresponding portion or plate of field plate termination 20. Similarly, resistor 18 is at node N4, i.e., the end thereof opposite to resistor 16, electrically connected by field plate connection 38 to a corresponding portion or plate of field plate termination 20 and to bond pad 24.

Field plate termination 20, as best shown in FIG. 4A, includes first field plate 42, second field plate 44 and third field plate 46. Each of field plates 42, 44 and 46 are constructed of a conductive material, such as metal or other, similar and suitable material. Field plates 42, 44 and 46 each have a respective width W1, W2 and W3. Field plates 42 and 44 are spaced apart from each other by a distance D1, field plates 44 and 46 are spaced apart from each other by a distance D2, and field plate 42 and the center of die street 22 are spaced apart from each other by a distance D3. As will be explained more particularly hereinafter, widths W1, W2 and W3 and distances D1, D2 and D3 are individually and separately adjusted, dependent at least in part upon the characteristics of the particular IC 10 with which field plate termination 20 is being used and to which field plate termination 20 is being adapted, to achieve a substantially uniform or "flat" electric field profile at the interface of field oxide layer 26 and device layer 28.

As described above, field plate 42 is electrically connected to node N2, field plate 44 is electrically connected to node N3, and field plate 46 is electrically connected to node N4. As also described above, resistor 14 is electrically connected to die street 22, which is at substantially the same voltage or potential level as the collector or drain of IC 10, resistor 16 electrically interconnects resistor 14 with resistor 18, and resistor 18 is electrically connected to bond pad 24, which is at substantially the same potential or voltage level as the emitter, source or gate (not referenced) of IC 10. For the sake of convenience, the emitter of IC 10 will hereinafter be assumed to be at ground potential or at a potential of approximately zero volts. Thus, resistors 14, 16 and 18 divide between themselves in proportion to their relative lengths/values the voltage differential that exists at the collector of IC 10. Resistors 14, 16 and 18 are of a predetermined length/value relative to each other.

More particularly, resistors 14, 16 and 18 are designed, i.e., have a predetermined length/value, such that from approximately fifty to approximately sixty percent of the voltage level at the collector of IC 10 appears across resistor 14, approximately twenty to approximately thirty percent of the voltage level at the collector of IC 10 appears across resistor 16, and approximately fifteen to approximately twenty percent of the voltage level at the collector of IC 10 appears across resistor 14. Preferably, approximately fifty-seven percent of the voltage level at the collector of IC 10 appears across resistor 14, approximately twenty-five percent of the voltage level at the collector of IC 10 appears across resistor 16, and approximately eighteen percent of the voltage level at the collector of IC 10 appears across resistor 18. The voltages dropped across resistors 14, 16 and 18 are applied to and bias field plates 42, 44 and 46, respectively. Thus, field plate 42 is biased with, for example, approximately fifty-seven percent, field plate 44 is biased with approximately twenty-five percent, and field plate 46 is biased with approximately eighteen percent of the collector voltage.

Figure 3A:
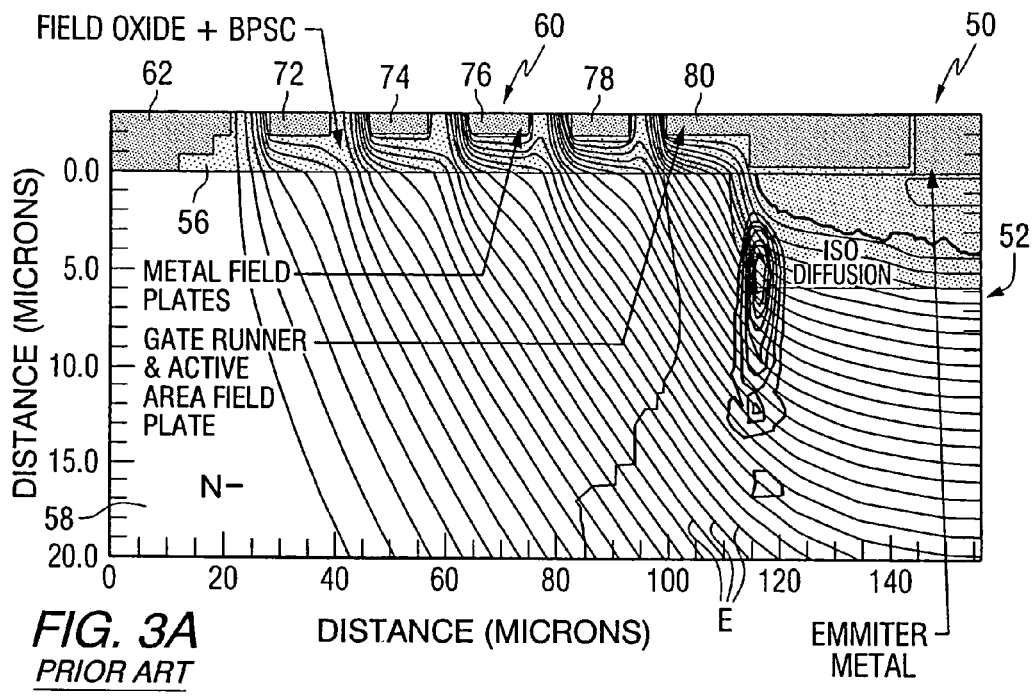
FIG. 3A is a cross-sectional view of, and shows the impact ionization/potential contour for, a prior art integrated circuit having a conventional metal field plate termination with fixed equal potential differences between five plates.

Referring now to FIG. 3A, an IC having a conventional field plate termination is shown. IC 50 includes die 52 having an insulating/field oxide layer 56, device layer 58, conventional field plate termination 60, and die street 62. Die 52 also includes various areas of high and/or low dopant concentrations as well as other typical and conventional features, none of which are referenced.

Conventional field plate termination 60 includes field plates 72, 74, 76, 78 and 80. Field plates 72, 74, 76, 78 and 80 are disposed at least partially within or over layer 56. Field plates 72, 74, 76, 78 and 80 are substantially equally spaced from each other and have substantially equal widths. Field plates 72, 74, 76, 78 and 80 are equally biased by the application of an equal voltage, such as, for example, by tapping off voltage for each plate from an equal number of series diodes (not shown) that are used as a collector to gate clamp, as is conventional and known in the art.

Figure 3B:
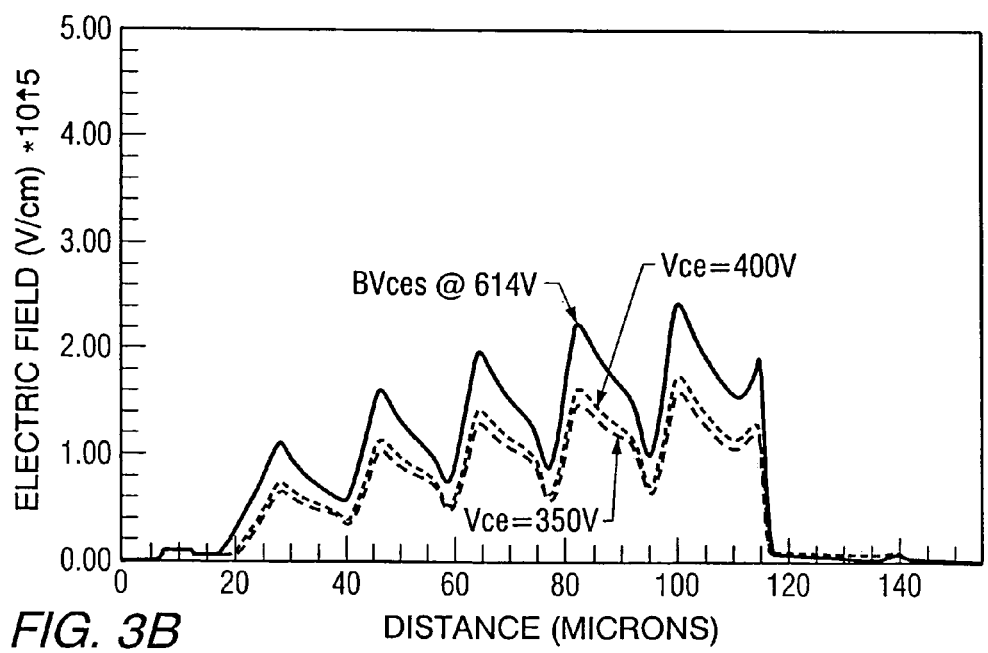
FIG. 3B is a plot of the horizontal electric field profile for the integrated circuit of FIG. 3A.

As best shown in FIG. 3B, the horizontal electrical field profile present at the interface of field oxide layer 56 and device layer 58 is not uniformly distributed across interface of field oxide layer 56 and device layer 58 nor is it evenly distributed across termination 60. Rather, the horizontal electrical field profile along the interface of field oxide layer 56 and device layer 58 becomes increasingly dense or crowded as the distance from die street 62 increases. Thus, the electrical field to which a plate relatively proximate to die street 62, such as, for example, field plate 72, is subjected is substantially less dense than the electrical field to which a plate further removed from die street 62, such as field plate 80, is subjected. More particularly, and with reference to FIG. 3B, the field present at field plate 72 is approximately 0.12 Kilovolts/centimeter whereas the field present at field plate 80 is approximately 0.26 Kilovolts/centimeter. This uneven distribution of the electrical field along the termination 60 and at the interface of field oxide layer 56 and device layer 58 lowers the breakdown voltage of IC 50 and/or requires an increased number of field plates to achieve a given breakdown voltage. Field plates consume valuable lateral space on die 52 that is in otherwise high demand, and therefore it is desirable to minimize the number of field plates required to achieve a given breakdown voltage.

Figure 4B:
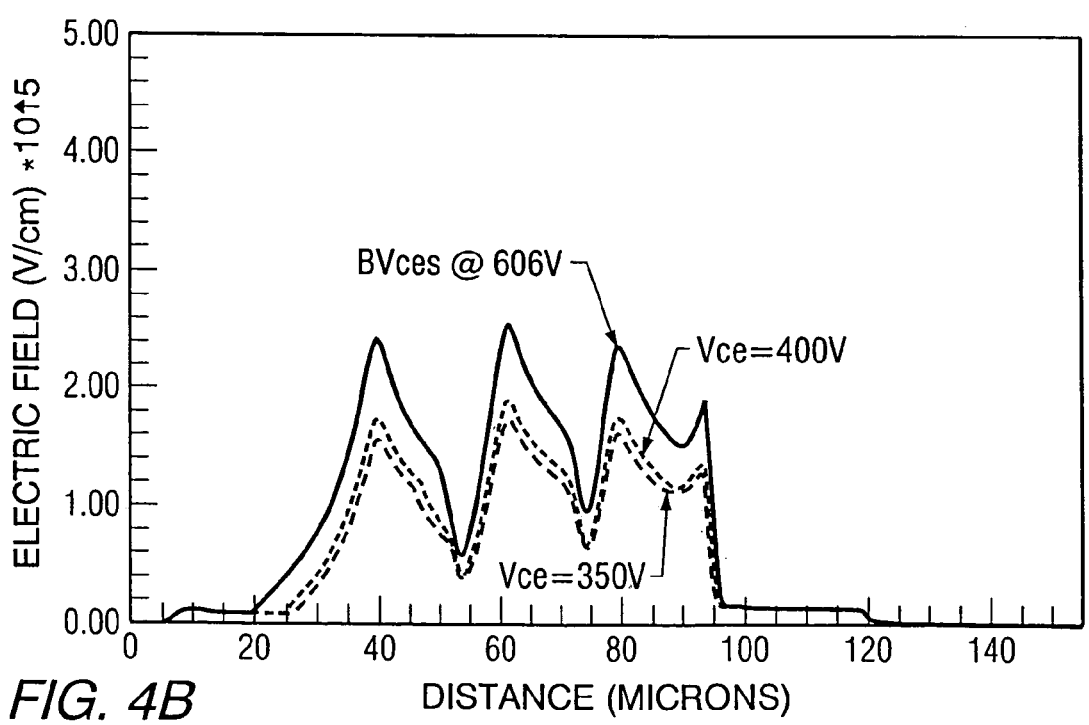
FIG. 4B is a plot of the horizontal electric field profile for the integrated circuit of FIG. 1.

In contrast, and with reference to FIG. 4B, IC 10 achieves a substantially uniform distribution of the electrical field profile in the horizontal direction along the interface of field oxide layer 26 and device layer 28. More particularly, IC 10 with field plate termination 20 distributes the electrical field substantially uniformly across field plates 42, 44 and 46, each of which are subjected to an electrical field of approximately 0.24 Kilovolts per centimeter. Field plate termination 20 equally distributes the electrical field and achieves approximately the same breakdown voltage by using only three field plates, rather than the five field plates required to do so in field plate termination 60 of IC 50. Thus, field plate termination 20 achieves approximately the same breakdown voltage as is achieved by the five-field plate termination 60 of IC 50 and yet consumes substantially less lateral space relative thereto.

In use, IC 10 with field plate termination 20 achieves a breakdown voltage that is approximately equal to the breakdown voltage achieved by conventional field plate terminations, but does so with fewer field plates and in less lateral space relative to a conventional field plate termination. Field plate termination 20 achieves this breakdown voltage by alleviating the crowding of the horizontal electrical field profile present at the interface of field oxide layer 56 and device layer 58 that occurs as the distance from die street 62 increases. The crowding of the horizontal electrical field is alleviated by applying a relatively high bias level to field plate 42, a reduced relative bias to field plate 44, and a further reduced relative bias to field plate 46. More particularly, and as described above, field plate 42 is biased with, for example, approximately fifty-seven percent, field plate 44 is biased with approximately twenty-five percent, and field plate 46 is biased with approximately eighteen percent of the collector voltage.

As described above, the horizontal electrical field tends to become increasingly crowded as the distance from die street 22 increases. Also as described above, the level at which field plates 42, 44, 46 are biased increases with proximity of the field plates to die street 22. The horizontal electrical field is drawn or dispersed in a direction toward die street 22 by the higher bias levels applied to the field plates proximate to die street 22, thereby more evenly distributing the horizontal electrical field and alleviating crowding at relatively distant locations from die street 22. Widths W1, W2 and W3, and distances D1 and D2, are also adjusted dependent at least in part upon the characteristics of IC 10 in order to more evenly distribute the horizontal electrical field.

The widths W1, W2 and W3 of field plates 42, 44 and 46, respecitvely, and distances D1, D2 and D3 are adjusted dependent at least in part upon the voltage to be applied to IC 10, i.e., the voltage rating of IC 10, to thereby optimize field plate termination 20.

It should be particularly noted that the value of resistors 14, 16 and 18 is of importance generally only to set or limit the maximum current shunted across the collector to emitter junction (not referenced) of IC 10 at a specified voltage. The percentage of the collector potential between each of field plates 42, 44 and 46 is fixed as a percentage of the resistor length/value.

It should further be particularly noted that the field plate termination of the present invention can be used with or without active clamping, and for MOSFET and/or IGBT designs with from approximately 30 Volts to greater than 1200 Volts. This is achieved by optimizing the number of field plates, field plate spacing, width, and biasing levels.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A power semiconductor device comprising:
   a substrate having a central region an and outer edge;
   an active region disposed in the central region of the substrate and defined by first and second regions highly doped with the same or opposite polarity of dopant;
   an insulating layer over the substrate and between the active region and the edge of the substrate;
   at least three field plates on the insulating layer and disposed between the active region and the outer edge of the substrate, said field plates each having an outer edge facing the edge of the substrate and an inner edge facing the active region and each having an applied voltage potential such that the voltage potential difference between the first and second field plates is different from the voltage potential difference between the second and third field plates to generate electric fields in the substrate below the field plates wherein said electric fields have substantially the same contours; and
   a voltage divider network of resistors.

2. The power semiconductor device of 1 wherein the first and second highly doped regions comprise an emitter and a collector, the voltage divider connected between the emitter and collector and having a plurality of resistors sized to generate the applied voltage for forming the electric fields with substantially similar contours.

3. A power semiconductor device comprising:
   a substrate having a central region an and outer edge;
   an active region disposed in the central region of the substrate and defined by first and second regions highly doped with the same or opposite polarity of dopant:
   an insulating layer over the substrate and between the active region and the edge of the substrate;
   at least three field plates on the insulating layer and disposed between the active region and the outer edge of the substrate, said field plates each having an outer edge facing the edge of the substrate and in inner edge facing the active region;
   means for applying different voltage bias levels to each field plate wherein the applied different voltage bias level generates electric fields in the substrate below the field plates and wherein said electric fields below said field plates have contours varying from the outer edge of the each field plate to the inner edge of each field plate and the contours of each electric filed below two or more field plates are substantially the same; and
   wherein the means for applying different voltage bias levels comprises a voltage divider network including a plurality of resistive elements connected in series to each other for generating said different bias voltages, each of said bias voltages being dependent at least in part upon a corresponding one of said resistive elements.

4. The power semiconductor device of claim 3, wherein said voltage divider network includes MOSFET devices.

5. The power semiconductor device of claim 3, wherein said voltage divider network includes a combination of MOSFET devices and resistors.

6. The power semiconductor device of claim 3, wherein the first and second highly doped regions comprise an emitter and a collector, said voltage divider network comprising a serpentine polysilicon resistor electrically connecting said emitter and said collector, said resistor having a length, said field plates being connected to said resistor at respective points along said length thereof 7. The power semiconductor device of claim 6, wherein said polysilicon resistor is uniformly doped along its length to provide a continuous resistance between the emitter and the collector.

8. The power semiconductor device of claim 6 wherein said voltage divider network electrically connects said edge with one of an emitter, source and gate of said power semiconductor device.

9. The power semiconductor device of claim 6, wherein the bias voltage applied to a particular one of said field plates is dependent at least in part upon the proximity of said particular one of said field plates to said edge.

10. The power semiconductor device of claim 9, wherein the bias voltage applied to a particular one of said field plates increases with the proximity of said particular one of said field plates to said edge.

11. The power semiconductor device of claim 9, wherein:
said first field plate is disposed relatively proximate to said edge, said second field plate is disposed between said first and third field plates relative to said edge, and said third field plate is disposed relatively distant from said edge; and
said voltage divider network being connected across a potential difference and generates a first, second and third voltage, said first voltage applied to said first field plate and being from approximately fifty to approximately sixty percent of said potential difference, said second voltage applied to said second field plate and being from approximately twenty to approximately thirty percent of said potential difference, and said third voltage applied to said third field plate and being from approximately fifteen to approximately twenty percent of said potential difference.

12. The power semiconductor device of claim 11, wherein said first voltage is approximately fifty-seven percent of said potential difference, said second voltage is approximately twenty-five percent of said potential difference, and said third voltage is approximately eighteen percent of said potential difference.

13. The power semiconductor device of claim 6, wherein said voltage divider network is integral and monolithic with said die.

14. The power semiconductor device of claim 6, wherein each of said plurality of field plates has a predetermined and respective width, said widths of said field plates being separately adjusted dependent at least in part upon a voltage rating of said power semiconductor device.

15. The power semiconductor device of claim 6, wherein each of said field plates is separated from adjacent field plate(s) by a predetermined and respective distance, said distances being adjusted dependent at least in part upon a voltage rating of said power semiconductor device.

16. A method of controlling the electric field concentration on the outside edge of a power semiconductor device comprising
in a substrate having a central region and an edge, forming an active region of a power semiconductor device comprising first and second regions highly doped with dopants of the same or opposite polarity;
forming an insulating layer between the active region and the edge;
disposing a plurality of field plates on said die, said field plates being spaced apart relative to each other;
dividing a potential difference to generate a different bias voltage for each field plate;
applying the respective different potentials to the respective field plates to generate electric fields in the substrate that have substantially the same electric field contours;
wherein said dividing step comprises electrically connecting one or more polysilicon resistors between said edge and one of an emitter and gate of said power semiconductor device.

17. A method of controlling the electric field concentration on the outside edge of a power semiconductor device comprising
in a substrate having a central region and an edge, forming an active region of a power semiconductor device comprising first and second regions highly doped with dopants of the same or opposite polarity;
forming an insulating layer between the active region and the edge;
disposing a plurality of field plates on said die, said field plates being spaced apart relative to each other;
dividing a potential difference to generate a different bias voltage for each field plate;
applying the respective different potentials to the respective field plates to generate electric fields in the substrate that have substantially the same electric field contours; and
wherein said dividing step comprises electrically connecting a series combination of resistors between said edge and one of an emitter and gate of a integrated circuit.

18. A method of controlling the electric field concentration on the outside edge of a power semiconductor device comprising
in a substrate having a central region and an edge, forming an active region of a power semiconductor device comprising first and second regions highly doped with dopants of the same or opposite polarity;
forming an insulating layer between the active region and the edge;
disposing a plurality of field plates on said die, said field plates being spaced apart relative to each other;
dividing a potential difference to generate a different bias voltage for each field plate;
applying the respective different potentials to the respective field plates to generate electric fields in the substrate that have substantially the same electric field contours; and
wherein said dividing step comprises electrically connecting a combination of resistors and MOSFET devices between a die street and one of an emitter and gate of a integrated circuit.

19. A method of controlling the electric field concentration on the outside edge of a power semiconductor device comprising
in a substrate having a central region and an edge, forming an active region of a power semiconductor device comprising first and second regions highly doped with dopants of the same or opposite polarity;
forming an insulating layer between the active region and the edge;
disposing a plurality of field plates on said die, said field plates being spaced apart relative to each other;
dividing a potential difference to generate a different bias voltage for each field plate;

applying the respective different potentials to the respective field plates to generate electric fields in the substrate that have substantially the same electric field contours;

wherein:

said disposing step comprises disposing first, second and third field plates on said die, said first field plate being relatively proximate to said die edge, said second field plate being disposed between said first and second field plates, and said third field plate being disposed relatively distant from said die street and proximate the active region; and said applying step comprises applying a first, second and third bias voltage to said first second and third field plates, respectively, said first bias voltage having a value of from approximately fifty to approximately sixty percent of said potential difference, said second bias voltage having a value of from approximately twenty to approximately thirty percent of said potential difference, and said third bias voltage having a value of from approximately fifteen to approximately twenty percent of said potential difference.

20. The method of claim 19 wherein said first bias voltage is approximately fifty-seven percent of said potential difference, said second bias voltage is approximately twenty-five percent of said potential difference, and said third bias voltage is approximately eighteen percent of said potential difference.

* * * * *